United States Patent
Takeuchi et al.

(10) Patent No.: US 12,009,801 B2
(45) Date of Patent: Jun. 11, 2024

(54) RESONATOR DEVICE

(71) Applicant: Seiko Epson Corporation, Tokyo (JP)

(72) Inventors: Junichi Takeuchi, Chino (JP);
Tomoyuki Kamakura, Matsumoto (JP);
Ryuta Nishizawa, Nagano (JP);
Yukihiro Hashi, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 380 days.

(21) Appl. No.: 17/456,237

(22) Filed: Nov. 23, 2021

(65) Prior Publication Data
US 2022/0173715 A1 Jun. 2, 2022

(30) Foreign Application Priority Data

Nov. 27, 2020 (JP) .................................. 2020-197300
Aug. 17, 2021 (JP) .................................. 2021-132598

(51) Int. Cl.
*H03H 9/09* (2006.01)
*H03H 9/05* (2006.01)
*H03H 9/125* (2006.01)

(52) U.S. Cl.
CPC ............ *H03H 9/09* (2013.01); *H03H 9/0514* (2013.01); *H03H 9/125* (2013.01)

(58) Field of Classification Search
CPC .......... H03H 9/09; H03H 9/19; H03H 9/1021; H03H 9/02133; H03H 9/0519; H03H 9/1014; H03H 9/02102; H03H 9/0514; H03H 9/0552; H03H 9/02023; H03H 3/02; H03H 9/05; H03H 9/10; H03H 9/132; H03H 2003/0428; H03H 9/17; H03H 9/15; H03H 9/13; H03H 9/0547; H03H 9/0542; H03H 3/04; H03B 5/32; H03B 5/326; H03B 2200/0022; H03B 5/30; H10N 30/87
See application file for complete search history.

(56) References Cited

U.S. PATENT DOCUMENTS

| | | | |
|---|---|---|---|
| 2007/0013268 A1* | 1/2007 | Kubo | .................. H03H 9/0523 310/365 |
| 2016/0197595 A1 | 7/2016 | Obata | |
| 2020/0083191 A1* | 3/2020 | Iwamoto | ................. H01L 23/12 |

FOREIGN PATENT DOCUMENTS

JP 2016-127469 A 7/2016

* cited by examiner

*Primary Examiner* — Lincoln D Donovan
*Assistant Examiner* — Tyler J Pereny
(74) *Attorney, Agent, or Firm* — Harness, Dickey & Pierce, P.L.C.

(57) ABSTRACT

A resonator device includes: a base; a resonator element that includes a resonator substrate and an electrode; a conductive layer that is disposed on the base; a metal bump that is disposed between the conductive layer and the resonator element, and that electrically couples the conductive layer and the electrode while bonding the conductive layer and the resonator element; and at least one of a first low elastic modulus layer that is interposed between the base and the conductive layer, that overlaps the metal bump in a plan view of the base, and that has an elastic modulus smaller than that of the metal bump, and a second low elastic modulus layer that is interposed between the resonator substrate and the electrode, that overlaps the metal bump in the plan view of the base, and that has an elastic modulus smaller than that of the metal bump.

5 Claims, 6 Drawing Sheets

RESONATOR DEVICE

The present application is based on, and claims priority from JP Application Serial No. 2020-197300, filed Nov. 27, 2020, and JP Application Serial No. 2021-132598, filed Aug. 17, 2021, the disclosure of which is hereby incorporated by reference herein in its entirety.

BACKGROUND

1. Technical Field

The present disclosure relates to a resonator device.

2. Related Art

JP-A-2016-127469 discloses a quartz crystal resonator as a resonator device in which a quartz crystal resonator element is fixed to a package via a metal bump.

However, since the metal bump has a high elastic modulus (Young's modulus) and is hard, for example, the metal bump is likely to be plastically deformed by thermal stress caused by a difference in linear expansion coefficient between the quartz crystal resonator element and the package. When the metal bump is plastically deformed, unnecessary vibration or frequency hysteresis may be generated in the quartz crystal resonator element, and vibration characteristics may be deteriorated.

SUMMARY

A resonator device according to the present disclosure includes: a base that has a first surface and a second surface which are in a front and back relationship; a resonator element that is positioned on a first surface side with respect to the base, and that includes a resonator substrate and an electrode disposed at a surface of the resonator substrate on a base side thereof; a conductive layer that is disposed at the first surface; a metal bump that is disposed between the base and the resonator element, and that electrically couples the conductive layer and the electrode while bonding the base and the resonator element; and at least one of a first low elastic modulus layer that is interposed between the base and the conductive layer, that overlaps the metal bump in a plan view of the base, and that has an elastic modulus smaller than that of the metal bump, and a second low elastic modulus layer that is interposed between the resonator substrate and the electrode, that overlaps the metal bump in the plan view of the base, and that has an elastic modulus smaller than that of the metal bump.

DESCRIPTION OF EXEMPLARY EMBODIMENTS

Figure 3:
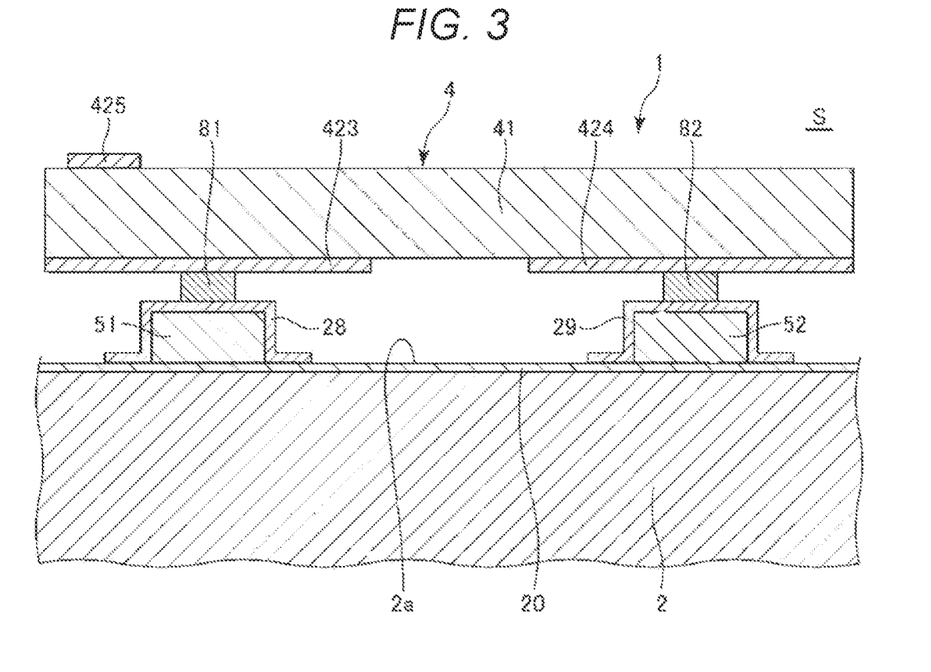
FIG. 3 is a cross-sectional view taken along a line B-B in FIG. 2.
Figure 4:
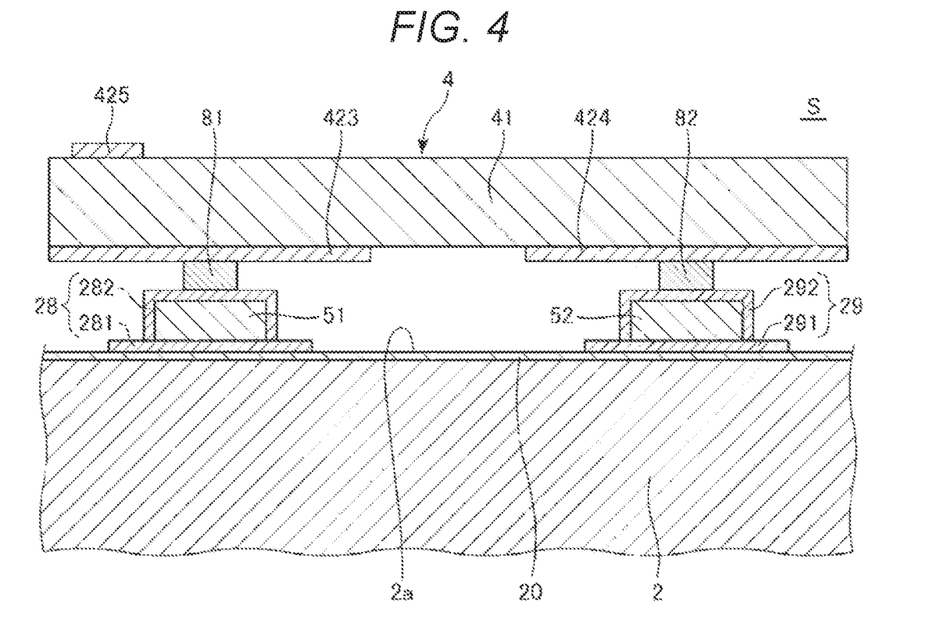
FIG. 4 is a cross-sectional view showing a modification.
Figure 5:
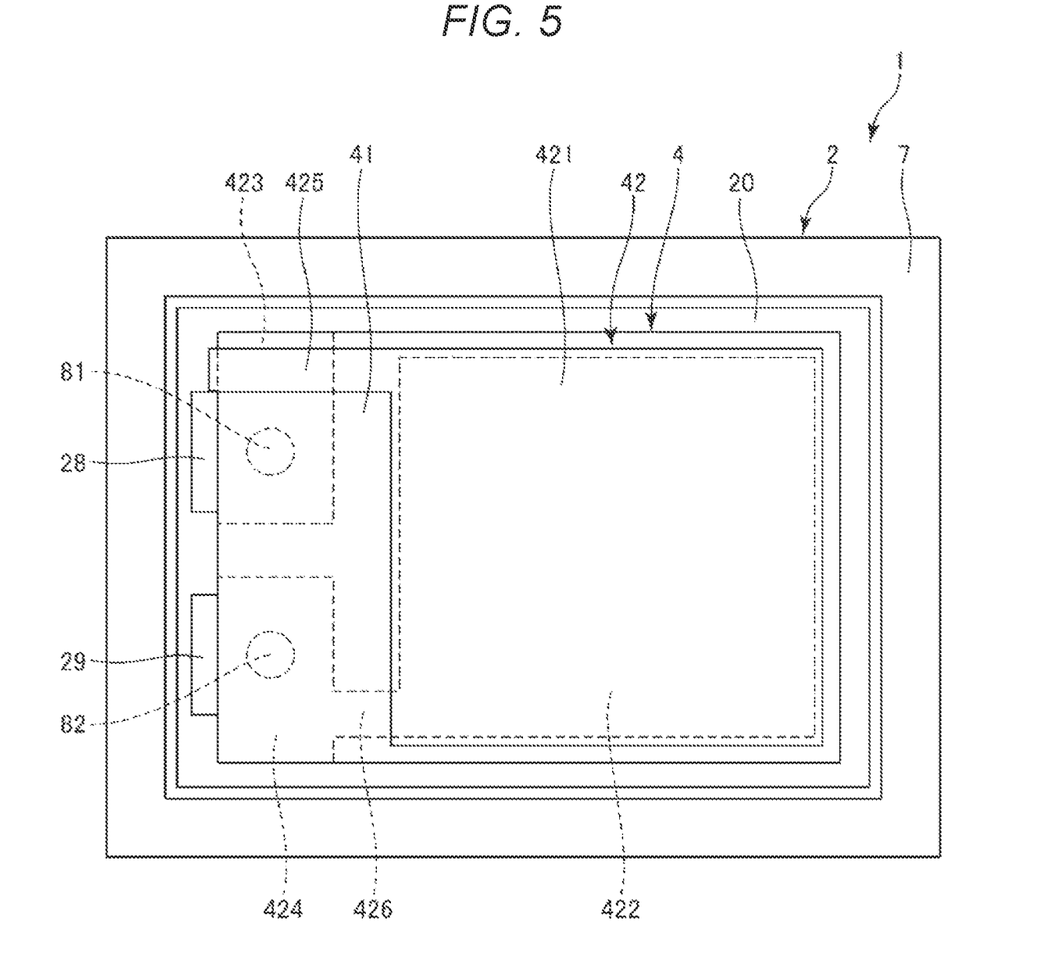
FIG. 5 is a plan view showing a resonator element.

Hereinafter, preferred embodiments of a resonator device will be described with reference to the accompanying drawings. For convenience of description, an upper side of a paper surface in FIGS. 1, 3, 4, 6, 7, and 8 is also referred to as "upper", and a lower side of the paper surface is also referred to as "lower". Further, a front side of a paper surface in FIGS. 2 and 5 is also referred to as "upper", and a back side of the paper surface is also referred to as "lower".

First Embodiment

Figure 1:
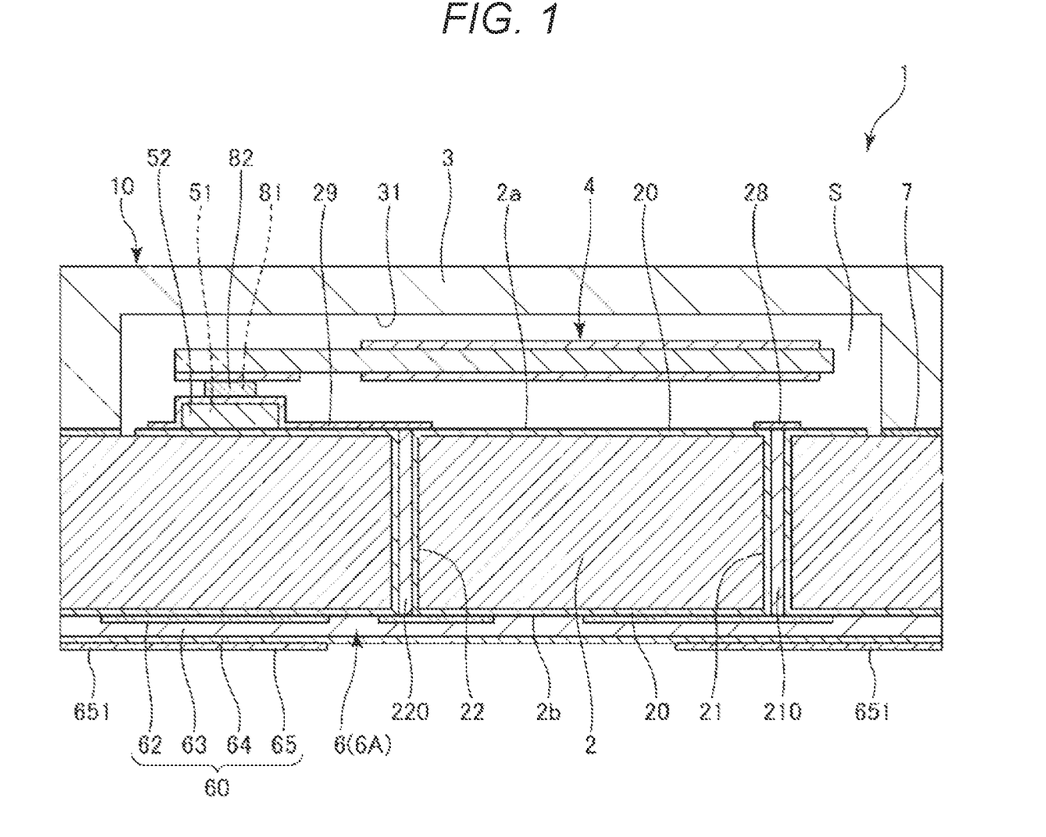
FIG. 1 is a cross-sectional view showing a resonator device according to a first embodiment.
Figure 2:
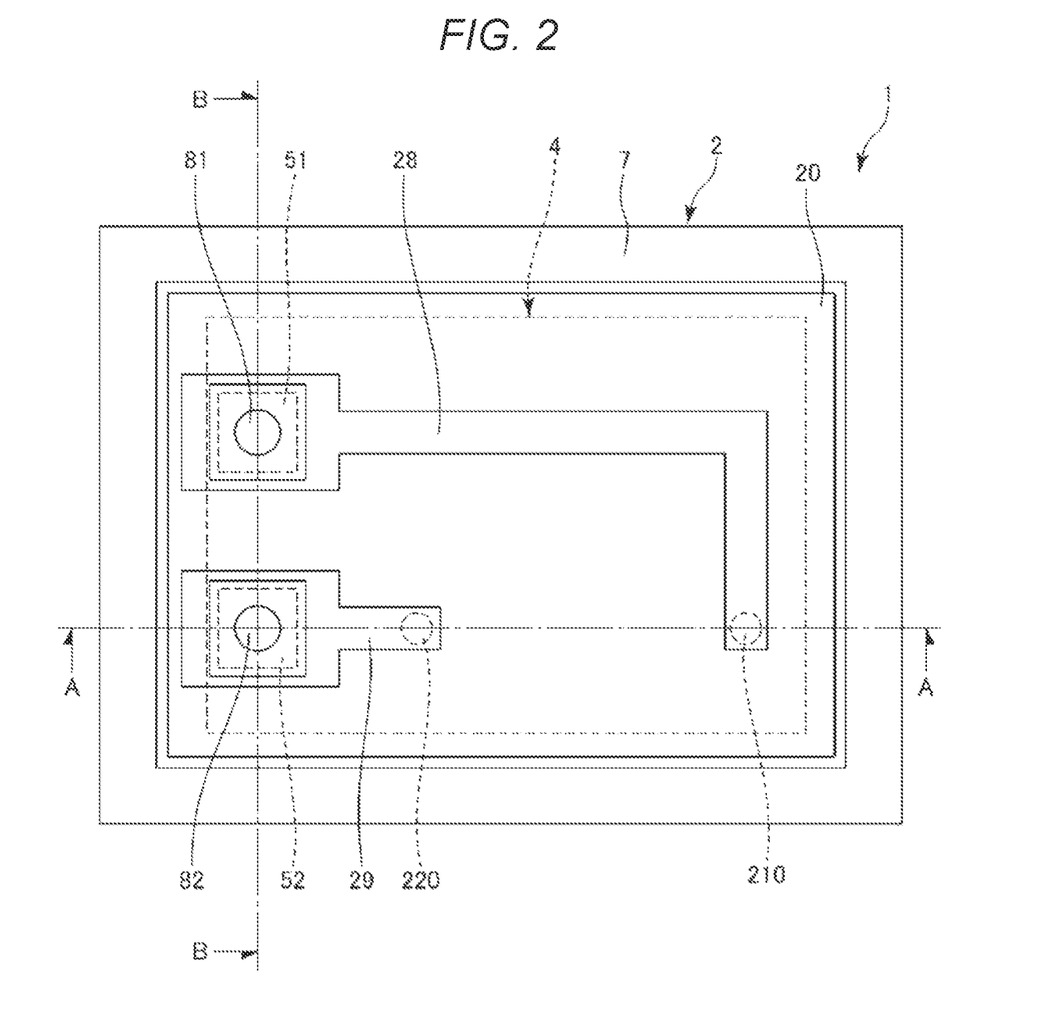
FIG. 2 is a plan view showing an upper surface of a base.

FIG. 1 is a cross-sectional view showing a resonator device according to a first embodiment. FIG. 2 is a plan view showing an upper surface of a base. FIG. 3 is a cross-sectional view taken along a line B-B in FIG. 2. FIG. 4 is a cross-sectional view showing a modification. FIG. 5 is a plan view showing a resonator element. FIG. 1 is a cross-sectional view taken along a line A-A in FIG. 2.

A resonator device 1 shown in FIG. 1 includes a package 10 including an accommodation portion S, and a resonator element 4 accommodated in the accommodation portion S. In addition, the package 10 includes a base 2 to which the resonator element 4 is bonded via a pair of metal bumps 81 and 82, and a lid 3 bonded to an upper surface 2a of the base 2 so as to cover the resonator element 4. An integrated circuit 6 including an oscillation circuit 6A is formed on the base 2.

The base 2 is a silicon substrate, in particular, a P-type silicon substrate. However, the base 2 is not particularly limited, and may be an N-type silicon substrate. Further, a semiconductor substrate of a material other than silicon, for example, a semiconductor substrate of such as Ge, GaP, GaAs, or InP may be used, or a substrate other than a semiconductor substrate such as a ceramic substrate may be used.

As shown in FIG. 1, the base 2 has a plate shape and has the upper surface 2a as a first surface and a lower surface 2b as a second surface, and the upper surface 2a and the lower surface 2b are in a front and back relationship. An insulating film 20 is formed on a surface of the base 2. The integrated circuit 6 electrically coupled to the resonator element 4 is formed on the lower surface 2b of the base 2. By forming the integrated circuit 6 on the base 2, the base 2 can be effectively used. In particular, by forming the integrated circuit 6 on the lower surface 2b, as compared with a case where the integrated circuit 6 is formed on the upper surface 2a, a wide space for forming the integrated circuit 6 can be secured since there is no bonding region with the lid 3. However, the integrated circuit 6 may be formed not on the lower surface 2b of the base 2 but on the upper surface 2a. The integrated circuit 6 may be omitted.

The integrated circuit 6 includes the oscillation circuit 6A that is electrically coupled to the resonator element 4 and generates an oscillation signal such as a clock signal by oscillating the resonator element 4. The integrated circuit 6 may include a circuit in addition to the oscillation circuit 6A. Examples of the circuit include a processing circuit that processes an output signal from the oscillation circuit 6A, and examples of such a processing circuit include a PLL circuit.

A stacked body 60 in which a wiring layer 62, an insulating layer 63, a passivation film 64, and a terminal layer 65 are stacked is formed on the lower surface 2b. Then, a plurality of active elements (not shown) formed on the lower surface 2b are electrically coupled via wirings in the wiring layer 62 to form the integrated circuit 6. The terminal layer 65 includes a plurality of mounting terminals 651 electrically coupled to the oscillation circuit 6A. Although one wiring layer 62 is included in the stacked body 60 in an illustrated configuration, the present disclosure is not limited thereto, and a plurality of wiring layers 62 may be stacked via the insulating layer 63. That is, the wiring layer 62 and the insulating layer 63 may be alternately stacked a plurality of times. As a result, for example, it is possible to increase a degree of freedom in routing the wiring in a circuit and installation of the plurality of mounting terminals 651.

A pair of through holes 21 and 22 are formed in the base 2 so as to pass through the base 2 in a thickness direction. The through holes 21 and 22 are filled with a conductive material, and through electrodes 210 and 220 are formed. As shown in FIGS. 1 and 2, a pair of wirings 28 and 29 as conductive layers electrically coupled to the resonator element 4 are disposed on the upper surface 2a of the base 2. The wiring 28 is electrically coupled to the oscillation circuit 6A via the through electrode 210, and the wiring 29 is electrically coupled to the oscillation circuit 6A via the through electrode 220.

In addition, first low elastic modulus layers 51 and 52 are disposed on the upper surface 2a of the base 2. An elastic modulus of the first low elastic modulus layers 51 and 52 is smaller than an elastic modulus of the metal bumps 81 and 82. Therefore, the first low elastic modulus layers 51 and 52 are softer than the metal bumps 81 and 82. The "elastic modulus" means the Young's modulus. The elastic modulus of the first low elastic modulus layers 51 and 52 is preferably 1/10 or less, more preferably 1/50 or less, and still more preferably 1/100 or less of the elastic modulus of the metal bumps 81 and 82.

Figure 9:
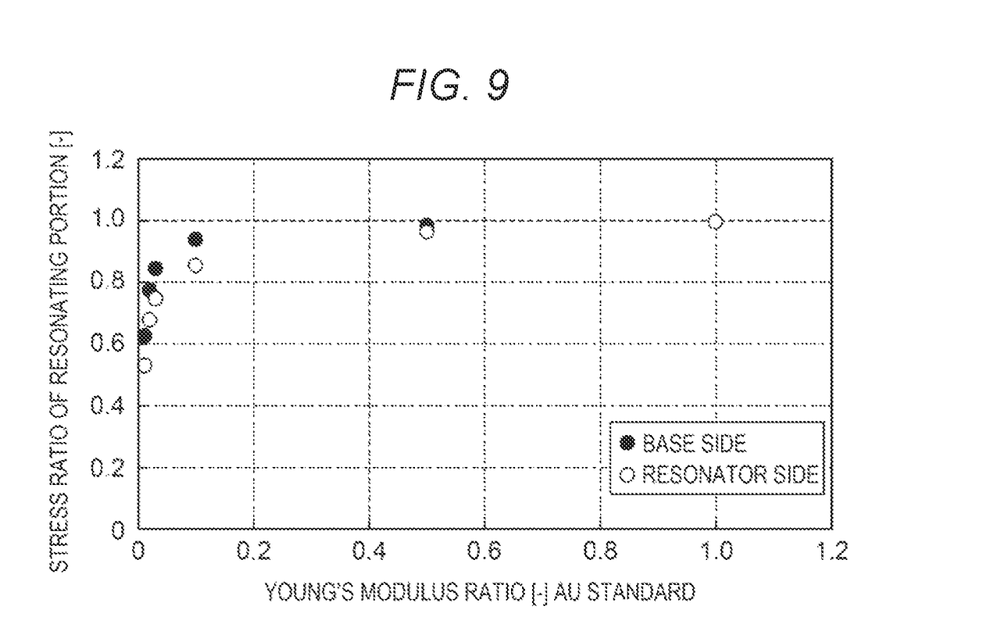
FIG. 9 is a graph showing a relationship between a Young's modulus ratio and a stress ratio.

Details will be described with reference to a graph shown in FIG. 9. In the graph shown in FIG. 9, a horizontal axis represents the Young's modulus ratio, and a vertical axis represents a stress ratio of a resonating portion. The graph shown in FIG. 9 shows a case where a low elastic modulus layer is disposed on a base 2 side and a case where a low elastic modulus layer is disposed on a resonator side. The low elastic modulus layer corresponds to the first low elastic modulus layers 51 and 52. The resonating portion corresponds to the resonator element 4.

In the graph shown in FIG. 9, when the metal bumps 81 and 82 are gold (Au) and the elastic modulus of the low elastic modulus layer is the same as that of the metal bumps 81 and 82 (horizontal axis=1), a stress change when a stress generated in the resonating portion is 1 (vertical axis=1) is plotted.

As in the present embodiment, when the first low elastic modulus layers 51 and 52 are disposed on the upper surface (referred to as a "base side" in FIG. 9) of the base 2, a preferable numerical range as described above can be obtained.

A constituent material of the first low elastic modulus layers 51 and 52 is not particularly limited as long as the elastic modulus thereof is smaller than the elastic modulus of the metal bumps 81 and 82, but is preferably, for example, a resin material. That is, it is preferable that the first low elastic modulus layers 51 and 52 are formed to contain a resin material. As a result, the first low elastic modulus layers 51 and 52 can be sufficiently softened with respect to the metal bumps 81 and 82. Among resin materials, a photosensitive resin material such as an ultraviolet curable resin is particularly preferable. As a result, microfabrication of the first low elastic modulus layers 51 and 52 is possible, the first low elastic modulus layers 51 and 52 can be formed with high accuracy, and a size of the resonator device 1 can be reduced. In addition, since the first low elastic modulus layers 51 and 52 can be formed using a semiconductor process, the resonator device 1 can be efficiently manufactured. The first low elastic modulus layers 51 and 52 of the present embodiment are made of epoxy resin. As a result, the first low elastic modulus layers 51 and 52 having appropriate flexibility are obtained. In addition to the epoxy resin, a polyimide resin or a phenol resin (which is a thermosetting resin material) may be used. In addition, an additive such as metal fillers may be mixed in the resin material for, for example, a purpose of adjusting a linear expansion coefficient, a purpose of imparting conductivity, and other purposes.

As shown in FIG. 3, an entire surface, that is, an upper surface and a side surface of the first low elastic modulus layer 51 are covered by the wiring 28. Similarly, an entire surface, that is, an upper surface and a side surface of the first low elastic modulus layer 52 are covered by the wiring 29. In this way, the first low elastic modulus layers 51 and 52 are covered by the wirings 28 and 29, so that gas (outgas) generated from the first low elastic modulus layers 51 and 52 can be confined in the wirings 28 and 29, and the gas can be prevented from being released into the accommodation portion S. Therefore, for example, it is possible to prevent the change and deterioration of the vibration characteristics of the resonator element 4 caused by contamination, pressure change, or the like of an atmosphere in the accommodation portion S due to the gas. Therefore, the resonator device 1 having excellent reliability is obtained.

In the present embodiment, the first low elastic modulus layers 51 and 52 are disposed on the upper surface 2a of the base 2, but the present disclosure is not limited thereto, and another layer may be interposed between the first low elastic modulus layers 51 and 52 and the base 2. For example, as shown in FIG. 4, the wirings 28 and 29 may have a two-layer structure including lower layers 281 and 291 and upper layers 282 and 292, the lower layers 281 and 291 may be disposed on the upper surface 2a, the first low elastic modulus layers 51 and 52 may be disposed on the lower layers 281 and 291, and the upper layers 282 and 292 may be disposed on the first low elastic modulus layers 51 and 52 so as to cover the first low elastic modulus layers 51 and 52 from above.

Similar to the base 2, the lid 3 is a silicon substrate. As a result, linear expansion coefficients of the base 2 and the lid 3 are equal, generation of thermal stress due to thermal expansion is prevented, and the resonator device 1 having the excellent vibration characteristics is obtained. In addition, since the resonator device 1 can be formed by the semiconductor process, the resonator device 1 can be manufactured with the high accuracy, and the size of the resonator device 1 can be reduced. The lid 3 is not particularly limited, and the semiconductor substrate of a material other than silicon, for example, a semiconductor substrate of such as Ge, GaP, GaAs, InP, or the like may be used. In addition, for example, a metal substrate such as kovar, or a substrate other than a semiconductor substrate such as a glass substrate may be used.

As shown in FIG. 1, the lid 3 includes a bottomed recess 31 that is opened in a lower surface of the lid 3 and accommodates the resonator element 4 therein. The lower surface of the lid 3 is directly bonded to the upper surface 2a of the base 2 via a bonding member 7. As a result, the accommodation portion S, that is a space accommodating the resonator element 4, is formed between the lid 3 and the base 2. In the present embodiment, the lid 3 is diffusion-bonded to the base 2 by utilizing diffusion between metals among the direct bonding. However, a bonding method between the lid 3 and the base 2 is not particularly limited.

The accommodation portion S is airtight, and is in a reduced pressure state, preferably in a state close to a vacuum. As a result, viscous resistance is reduced, and oscillation characteristics of the resonator element 4 are improved. The atmosphere of the accommodation portion S is not particularly limited, and may be, for example, an atmosphere in which an inert gas such as nitrogen or Ar is sealed, or may be an atmospheric pressure state or a pressurized state instead of the reduced pressure state.

As shown in FIG. 5, the resonator element 4 includes a resonator substrate 41 and an electrode 42 disposed on a surface of the resonator substrate 41. The resonator substrate 41 has a thickness-shear vibration mode, and is formed of an AT-cut quartz crystal substrate in the present embodiment. Since the AT-cut quartz crystal substrate has tertiary frequency-temperature characteristics, the AT-cut quartz crystal substrate is set as the resonator element 4 having excellent temperature characteristics. The electrode 42 includes an excitation electrode 421 disposed on an upper surface of the resonator substrate 41 and an excitation electrode 422 disposed on a lower surface so as to face the excitation electrode 421. The electrode 42 includes a pair of terminals 423 and 424 disposed on a lower surface of the resonator substrate 41, a wiring 425 that electrically couples the terminal 423 and the excitation electrode 421, and a wiring 426 that electrically couples the terminal 424 and the excitation electrode 422.

A configuration of the resonator element 4 is not limited to the above configuration. For example, the resonator element 4 may be one of a mesa type in which a vibration region sandwiched between the excitation electrodes 421 and 422 protrudes from a periphery of the resonator element 4, or conversely, may be one of an inverted mesa type in which the vibration region is recessed from the periphery of the resonator element 4. In addition, bevel processing for grinding the periphery of the resonator substrate 41 and convex processing for processing the upper surface and the lower surface into convex curved surfaces may be performed.

Further, the resonator element 4 is not limited to one that vibrates in the thickness-shear vibration mode, and for example, may be a resonator element in which a plurality of vibrating arms bent and vibrate in an in-plane direction such as a tuning fork type resonator element. That is, the resonator substrate 41 is not limited to one formed of the AT-cut quartz crystal substrate, and may be formed of a quartz crystal substrate other than the AT-cut quartz crystal substrate, for example, an X-cut quartz crystal substrate, a Y-cut quartz crystal substrate, a Z-cut quartz crystal substrate, a BT-cut quartz crystal substrate, an SC-cut quartz crystal substrate, an ST-cut quartz crystal substrate, or the like.

A constituent material of the resonator substrate 41 is not limited to a quartz crystal, and may be formed of a piezoelectric single crystal body of such as lithium niobate, lithium tantalate, lithium tetraborate, langasite crystal, potassium niobate, or gallium phosphate, or may be formed of the piezoelectric single crystal body of a material other than these components. Furthermore, the resonator element 4 is not limited to a piezoelectric drive type resonator piece, and may be an electrostatic drive type resonator piece using an electrostatic force.

As shown in FIG. 3, the resonator element 4 as described above is bonded to the base 2 by the pair of metal bumps 81 and 82, and is electrically coupled to the wirings 28 and 29. The metal bumps 81 and 82 are stud bumps, plated bumps, or the like.

The metal bump 81 is disposed on a portion of the wiring 28 located above the first low elastic modulus layer 51. That is, the metal bump 81 is disposed on the wiring 28 so as to overlap the first low elastic modulus layer 51 in a plan view of the base 2. A lower surface of the metal bump 81 is bonded to the wiring 28 and an upper surface of the metal bump 81 is bonded to the terminal 423. As a result, the resonator element 4 and the base 2 are bonded by the metal bump 81, and the wiring 28 and the terminal 423 are electrically coupled to each other by the metal bump 81. Similarly, the metal bump 82 is disposed on a portion of the wiring 29 located above the first low elastic modulus layer 52. That is, the metal bump 82 is disposed on the wiring 29 so as to overlap the first low elastic modulus layer 52 in the plan view of the base 2. A lower surface of the metal bump 82 is bonded to the wiring 29 and an upper surface of the metal bump 82 is bonded to the terminal 424. As a result, the resonator element 4 and the base 2 are bonded by the metal bump 82, and the wiring 29 and the terminal 424 are electrically coupled to each other by the metal bump 82.

The metal bumps 81 and 82 are bonded to the wirings 28 and 29 by ultrasonic bonding, and bonded to the terminals 423 and 424 by thermocompression bonding, for example. However, the bonding method is not particularly limited.

The metal bumps 81 and 82 are not particularly limited, and, for example, gold bumps, silver bumps, copper bumps, solder bumps, and the like may be used. Constituent materials of the metal bumps 81 and 82 are preferably the same as materials of outermost layers of the wirings 28 and 29 and materials of outermost layers of the terminals 423 and 424. For example, when the outermost layers of the wirings 28 and 29 and the terminals 423 and 424 are formed of gold (Au), the metal bumps 81 and 82 are preferably gold bumps. As a result, affinity among the wirings 28 and 29 and the terminals 423 and 424 and the metal bumps 81 and 82 increases, and a high bonding strength can be obtained.

In this way, by using the metal bumps 81 and 82 to the bonding between the resonator element 4 and the base 2, it is possible to reduce the size of the resonator device 1. Briefly describing, for example, when a conductive adhesive in a paste form is used instead of the metal bumps 81 and 82 for the bonding, a diameter of the conductive adhesive increases when the conductive adhesive is applied to the base 2 or when the resonator element 4 is pressed against the conductive adhesive. Therefore, it is difficult to reduce the diameter of the conductive adhesive. In addition, there is a risk that the conductive adhesives come into contact with each other due to such a spread of the diameter, and it is also necessary to dispose the conductive adhesives sufficiently apart from each other in order to eliminate the risk. Therefore, a large space is required to dispose the conductive adhesives, which leads to an increase in the size of the resonator device 1. In contrast, according to the metal bumps 81 and 82, there is almost no increase in diameter as the conductive adhesive. Therefore, the metal bumps 81 and 82 themselves have a sufficiently small diameter, and a distance between the metal bumps 81 and 82 can be further reduced. As a result, the metal bumps 81 and 82 can be disposed in a small space, and the size of the resonator device 1 can be reduced. In addition, since the gas is generated less as compared with the conductive adhesive, it is possible to prevent the change and the deterioration of the vibration characteristics of the resonator element 4 caused by the contamination, the pressure change, or the like of the atmosphere in the accommodation portion S due to the gas. Therefore, the resonator device 1 having excellent reliability is obtained.

In this way, there are merits of reducing the size of the resonator device 1 while preventing the generation of the gas by using the metal bumps 81 and 82 to the bonding between the resonator element 4 and the base 2, but on the contrary, there are also the following demerits. Since the metal bumps 81 and 82 are made of a metal material, the Young's modulus is high. Therefore, for example, the metal bumps 81 and 82 may be plastically deformed due to the thermal stress applied during the manufacturing process of the resonator device 1, in particular, the thermal stress caused by the difference in linear expansion coefficient between the base 2 and the resonator element 4, an impact received after manufacturing, or the like, unintended stress may be applied to the resonator element 4, frequency characteristics of the resonator element 4 may be deteriorated, and unnecessary vibration or frequency hysteresis may be generated due to the plastic deformation.

Therefore, in the resonator device 1, in order to prevent the plastic deformation of the metal bumps 81 and 82, the metal bumps 81 and 82 are disposed on the first low elastic modulus layers 51 and 52. That is, the first low elastic modulus layers 51 and 52 softer than the metal bumps 81 and 82 are interposed between the metal bumps 81 and 82 and the base 2. As a result, the thermal stress and the impact as described above can be absorbed and alleviated by the first low elastic modulus layers 51 and 52, and the plastic deformation of the metal bumps 81 and 82 can be prevented. Therefore, it is possible to effectively prevent the deterioration of the frequency characteristics of the resonator element 4, and the generation of the unnecessary vibration, and the frequency hysteresis.

The resonator device 1 is described above. As described above, the resonator device 1 includes the base 2 having the upper surface 2a as the first surface and the lower surface 2b as the second surface which are in the front and back relationship; the resonator element 4 that is positioned on an upper surface 2a side with respect to the base 2, and that includes the resonator substrate 41 and the electrode 42 disposed at a surface of the resonator substrate 41 on a base 2 side thereof; the wirings 28 and 29 as the conductive layers disposed at the upper surface 2a; the metal bumps 81 and 82 that are disposed between the base 2 and the resonator element 4, and that bond and electrically couple the base 2 and the resonator element 4; and the first low elastic modulus layers 51 and 52 that are interposed between the base 2 and the wirings 28 and 29, that overlap the metal bumps 81 and 82 in a plan view of the base 2, and that have an elastic modulus smaller than that of the metal bumps 81 and 82. According to such a configuration, the first low elastic modulus layers 51 and 52 absorb and alleviate the stress, so that the plastic deformation of the metal bumps 81 and 82 can be effectively prevented. Therefore, it is possible to effectively prevent the deterioration of the frequency characteristics of the resonator element 4, the generation of the unnecessary vibration and the frequency hysteresis. As a result, the resonator device 1 having excellent reliability is obtained.

As described above, the first low elastic modulus layers 51 and 52 are covered by the wirings 28 and 29. Accordingly, the gas generated from the first low elastic modulus layers 51 and 52 can be confined in the wirings 28 and 29, and the gas can be prevented from being released into the accommodation portion S. Therefore, it is possible to prevent the change and the deterioration of the vibration characteristics of the resonator element 4 caused by the contamination, the pressure change, or the like of the atmosphere in the accommodation portion S due to the gas. As a result, the resonator device 1 having excellent reliability is obtained.

As described above, the first low elastic modulus layers 51 and 52 are formed to contain the resin material. As a result, the first low elastic modulus layers 51 and 52 can be sufficiently softened with respect to the metal bumps 81 and 82.

As described above, the resonator device 1 includes the oscillation circuit 6A disposed at the lower surface 2b and electrically coupled to the resonator element 4. As a result, the base 2 can be effectively used. Further, a wiring length between the oscillation circuit 6A and the resonator element 4 can be shortened, which makes it difficult for noise to ride.

Second Embodiment

Figure 6:
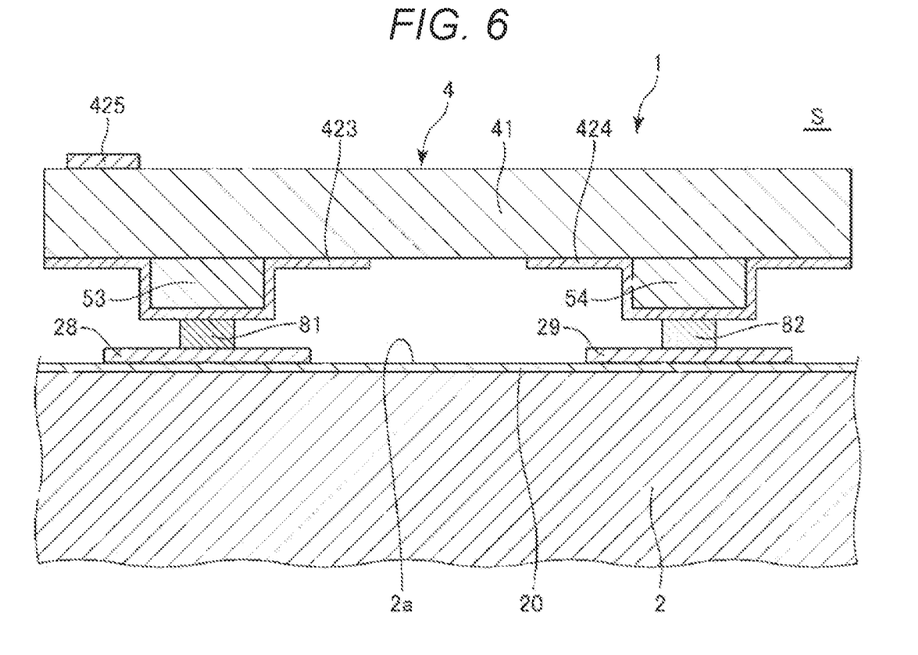
FIG. 6 is a cross-sectional view showing a resonator device according to a second embodiment.
Figure 7:
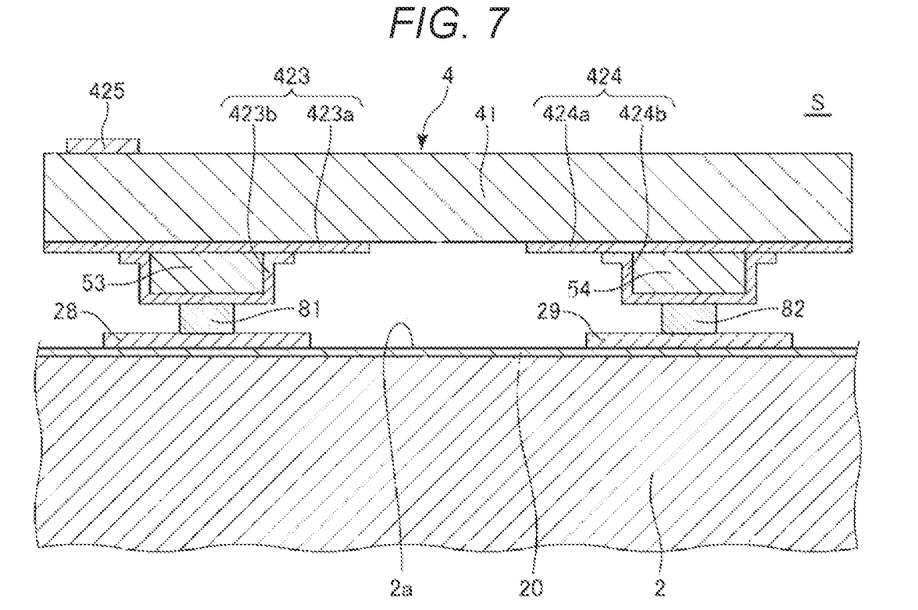
FIG. 7 is a cross-sectional view showing a modification.

FIG. 6 is a cross-sectional view showing a resonator device according to a second embodiment. FIG. 7 is a cross-sectional view showing a modification. FIG. 6 is a view corresponding to FIG. 3 of the first embodiment.

The present embodiment is the same as the first embodiment except that second low elastic modulus layers 53 and 54 are provided instead of the first low elastic modulus layers 51 and 52. In the following description, the present embodiment will be described focusing on differences with the above described embodiment, and description of the same matters will be omitted. In FIG. 6, the same components as those of the above-described embodiment are denoted by the same reference numerals.

In the resonator device 1 of the present embodiment, as shown in FIG. 6, the first low elastic modulus layers 51 and 52 are omitted. Instead, the resonator element 4 includes the second low elastic modulus layers 53 and 54 disposed on the lower surface of the resonator substrate 41. The terminal 423 is disposed on a lower surface of the second low elastic modulus layer 53, and the terminal 424 is disposed on a lower surface of the second low elastic modulus layer 54. That is, the second low elastic modulus layer 53 is interposed between the resonator substrate 41 and the terminal 423, and the second low elastic modulus layer 54 is interposed between the resonator substrate 41 and the terminal 424. Since the second low elastic modulus layers 53 and 54 can have the same configuration as the first low elastic modulus layers 51 and 52, the description thereof will be omitted.

The metal bump 81 overlaps the second low elastic modulus layer 53 in the plan view of the base 2. A lower surface of the metal bump 81 is bonded to the wiring 28, and an upper surface of the metal bump 81 is bonded to a portion of the terminal 423 that is disposed below the second low elastic modulus layer 53. As a result, the resonator element 4 and the base 2 are bonded by the metal bump 81, and the wiring 28 and the terminal 423 are electrically coupled to each other by the metal bump 81. Similarly, the metal bump 82 overlaps the second low elastic modulus layer 54 in the plan view of the base 2. A lower surface of the metal bump 82 is bonded to the wiring 29, and an upper surface of the metal bump 82 is bonded to a portion of the terminal 424 that is disposed below the second low elastic modulus layer 54. As a result, the resonator element 4 and the base 2 are bonded by the metal bump 82, and the wiring 29 and the terminal 424 are electrically coupled to each other by the metal bump 82.

The second low elastic modulus layers 53 and 54 are disposed on the lower surface of the resonator substrate 41. The elastic modulus of the second low elastic modulus layers 53 and 54 is smaller than the elastic modulus of the metal bumps 81 and 82. Therefore, the second low elastic modulus layers 53 and 54 are softer than the metal bumps 81 and 82. The "elastic modulus" means the Young's modulus. The elastic modulus of the second low elastic modulus layers 53 and 54 is preferably ⅒ or less, more preferably ½₀ or less, and still more preferably ¹⁄₁₀₀ or less of the elastic modulus of the metal bumps 81 and 82.

The details will be described with reference to the graph shown in FIG. 9. As described above, in the graph shown in FIG. 9, the horizontal axis represents the Young's modulus ratio, and the vertical axis represents the stress ratio of the resonating portion. The low elastic modulus layer corresponds to the second low elastic modulus layers and 54. The resonating portion corresponds to the resonator element 4.

Further, similarly to the above, when the metal bumps 81 and 82 are gold (Au) and the elastic modulus of the low elastic modulus layer is the same as that of the metal bumps 81 and 82 (horizontal axis=1), the stress change when the stress generated in the resonating portion is 1 (vertical axis=1) is plotted.

As in the present embodiment, when the second low elastic modulus layers 53 and 54 are disposed on the lower surface (referred to as the "resonator side" in FIG. 9) of the resonator element 4, the preferable numerical range as described above can be obtained.

As described above, by interposing the second low elastic modulus layers 53 and 54 softer than the metal bumps 81 and 82 between the metal bumps 81 and 82 and the resonator substrate 41, as in the first embodiment described above, the thermal stress and the impact can be absorbed and alleviated by the second low elastic modulus layers 53 and 54, and the plastic deformation of the metal bumps 81 and can be prevented. Therefore, it is possible to effectively prevent the deterioration of the frequency characteristics of the resonator element 4, and the generation of the unnecessary vibration and the frequency hysteresis.

In particular, a surface, that is, a lower surface and a side surface of the second low elastic modulus layer 53 are covered by the terminal 423, and a surface, that is, a lower surface and a side surface of the second low elastic modulus layer 54 are covered by the terminal 424. In this way, by covering the second low elastic modulus layers 53 and 54 by the terminals 423 and 424, gas (outgas) generated from the second low elastic modulus layers 53 and 54 can be confined in the terminals 423 and 424, and the gas can be prevented from being released into the accommodation portion S. Therefore, for example, it is possible to prevent the change and the deterioration of the vibration characteristics of the resonator element 4 caused by the contamination, the pressure change, or the like of the atmosphere in the accommodation portion S due to the gas. Therefore, the resonator device 1 having excellent reliability is obtained. Configurations of the second low elastic modulus layers 53 and 54 are not particularly limited, and a part thereof may be exposed respectively from the terminals 423 and 424.

In the present embodiment, the second low elastic modulus layers 53 and 54 are disposed on the lower surface of the resonator substrate 41, but the present disclosure is not limited thereto, and another layer may be interposed between the second low elastic modulus layers 53 and 54 and the resonator substrate 41. For example, as shown in FIG. 7, the terminals 423 and 424 may have a two-layer structure including lower layers 423a and 424a and upper layers 423b and 424b, the lower layers 423a and 424a may be disposed on lower surfaces of the terminals 423 and 424, the second low elastic modulus layers 53 and 54 may be disposed on the lower layers 423a and 424a, and the upper layers 423b and 424b may be disposed on the second low elastic modulus layers 53 and 54 so as to cover the second low elastic modulus layers 53 and 54 from above.

The resonator device 1 is described above. As described above, the resonator device 1 includes the base 2 having the upper surface 2a as the first surface and the lower surface 2b as the second surface which are in a front and back relationship; the resonator element 4 that is positioned on an upper surface 2a side with respect to the base 2, and that includes the resonator substrate 41 and the electrode 42 disposed at a surface of the resonator substrate 41 on a base 2 side thereof; the wirings 28 and 29 as the conductive layers disposed at the upper surface 2a; the metal bumps 81 and 82 that are disposed between the base 2 and the resonator element 4, and that bond and electrically couple the base 2 and the resonator element 4; and the second low elastic modulus layers 53 and 54 that are interposed between the resonator substrate 41 and the electrode 42, that overlap the metal bumps 81 and 82 in the plan view of the base 2, and that have an elastic modulus smaller than that of the metal bumps 81 and 82. According to such a configuration, the second low elastic modulus layers 53 and 54 absorb and alleviate the stress, so that the plastic deformation of the metal bumps 81 and 82 can be effectively prevented. Therefore, it is possible to effectively prevent the deterioration of the frequency characteristics of the resonator element 4, the generation of the unnecessary vibration and the frequency hysteresis. As a result, the resonator device 1 having excellent reliability is obtained.

The second embodiment as described above can also exert the same effect as the first embodiment described above.

Third Embodiment

Figure 8:
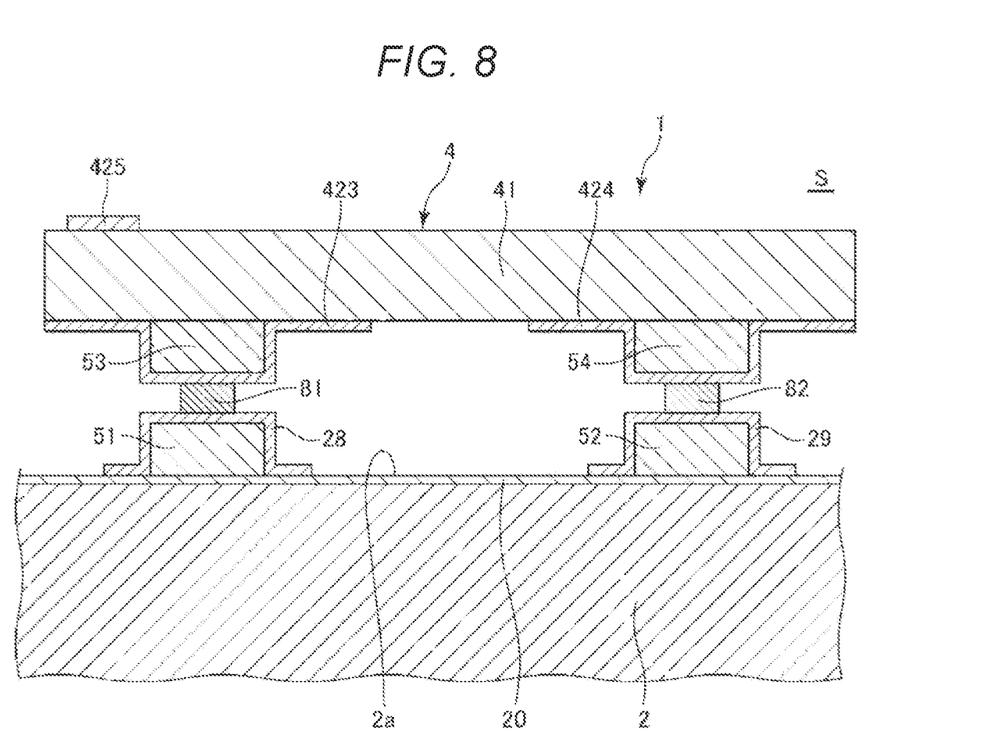
FIG. 8 is a cross-sectional view showing a resonator device according to a third embodiment.

FIG. 8 is a cross-sectional view showing a resonator device according to a third embodiment. FIG. 8 is a view corresponding to FIG. 3 of the first embodiment described above.

The present embodiment is the same as the first embodiment described above except that the second low elastic modulus layers 53 and 54 are provided in addition to the first low elastic modulus layers 51 and 52. That is, the present embodiment is a combination of the first embodiment and the second embodiment described above. In the following description, the present embodiment will be described focusing on differences with the above described embodiments, and the description of the same matters will be omitted. In FIG. 8, the same components as those of the above-described embodiments are denoted by the same reference numerals.

In the resonator device 1 of the present embodiment, as shown in FIG. 8, the resonator element 4 includes the second low elastic modulus layers 53 and 54 disposed on the lower surface of the resonator substrate 41. Since the second low elastic modulus layers 53 and 54 can have the same configuration as the first low elastic modulus layers 51 and 52, the description thereof will be omitted. The terminal 423 is disposed on the lower surface of the second low elastic modulus layer 53, and the terminal 424 is disposed on the lower surface of the second low elastic modulus layer 54.

That is, the second low elastic modulus layer 53 is interposed between the resonator substrate 41 and the terminal 423, and the second low elastic modulus layer 54 is interposed between the resonator substrate 41 and the terminal 424.

As described above, in the resonator device 1 of the present embodiment, the first low elastic modulus layers and 52 softer than the metal bumps 81 and 82 are interposed between the metal bumps 81 and 82 and the base 2, and the second low elastic modulus layers 53 and 54 softer than the metal bumps 81 and 82 are interposed between the metal bumps 81 and 82 and the resonator substrate 41. As a result, the thermal stress and the impact can be absorbed and alleviated by the first low elastic modulus layers 51 and 52 and the second low elastic modulus layers 53 and 54, and the plastic deformation of the metal bumps 81 and 82 can be more effectively prevented. Therefore, it is possible to effectively prevent the deterioration of the frequency characteristics of the resonator element 4, and the generation of the unnecessary vibration and the frequency hysteresis.

The resonator device 1 is described above. As described above, the resonator device 1 includes the base 2 having the upper surface 2a as the first surface and the lower surface 2b as the second surface which are in a front and back relationship; the resonator element 4 that is positioned on an upper surface 2a side with respect to the base 2, and that includes the resonator substrate 41 and the electrode 42 disposed at a surface of the resonator substrate 41 on a base 2 side thereof; the wirings 28 and 29 as the conductive layers disposed at the upper surface 2a; the metal bumps 81 and 82 that are disposed between the base 2 and the resonator element 4, and that bond and electrically couple the base 2 and the resonator element 4; the first low elastic modulus layers 51 and 52 that are interposed between the base 2 and the wirings 28 and 29, that overlap the metal bumps 81 and 82 in a plan view of the base 2, and that have an elastic modulus smaller than that of the metal bumps 81 and 82; and the second low elastic modulus layers 53 and 54 that are interposed between the resonator substrate 41 and the electrode 42, that overlap the metal bumps 81 and 82 in the plan view of the base 2, and that have an elastic modulus smaller than that of the metal bumps 81 and 82. According to such a configuration, the first low elastic modulus layers 51 and 52 and the second low elastic modulus layers 53 and 54 can absorb and alleviate the stress, so that the plastic deformation of the metal bumps 81 and 82 can be effectively prevented. Therefore, it is possible to effectively prevent the deterioration of the frequency characteristics of the resonator element 4, the generation of the unnecessary vibration and the frequency hysteresis. As a result, the resonator device 1 having excellent reliability is obtained.

The third embodiment as described above can also exert the same effect as the first embodiment described above.

As described above, although the resonator device according to the present disclosure is described based on illustrated embodiments, the present disclosure is not limited thereto. A configuration of each part can be replaced with any configuration having a similar function. Further, any other constituents may be added to the present disclosure. Further, each of the embodiments may be combined as appropriate.

What is claimed is:

1. A resonator device, comprising:
   a base that has a first surface and a second surface which are in a front and back relationship;
   a resonator element that is positioned on a first surface side with respect to the base, and that includes a resonator substrate and an electrode disposed at a surface of the resonator substrate on a base side thereof;
   a conductive layer that is disposed at the first surface;
   a metal bump that is disposed between the base and the resonator element, and that electrically couples the conductive layer and the electrode while bonding the base and the resonator element; and
   at least one of
      a first low elastic modulus layer that is interposed between the base and the conductive layer, that overlaps the metal bump in a plan view of the base, and that has an elastic modulus smaller than that of the metal bump, and
      a second low elastic modulus layer that is interposed between the resonator substrate and the electrode, that overlaps the metal bump in the plan view of the base, and that has an elastic modulus smaller than that of the metal bump.

2. The resonator device according to claim 1, wherein the elastic modulus of the first low elastic modulus layer and the second low elastic modulus layer is 1/10 or less of the elastic modulus of the metal bump.

3. The resonator device according to claim 1, wherein the first low elastic modulus layer and the second low elastic modulus layer are covered by the conductive layer.

4. The resonator device according to claim 1, wherein the first low elastic modulus layer and the second low elastic modulus layer are formed to contain a resin material.

5. The resonator device according to claim 1, further comprising:
   an oscillation circuit that is disposed at the second surface and that is electrically coupled to the resonator element.

* * * * *